US012112237B2

(12) United States Patent
Kim et al.

(10) Patent No.: US 12,112,237 B2
(45) Date of Patent: Oct. 8, 2024

(54) MICROWAVE-OPTIC CONVERSION SYSTEM OF QUANTUM SIGNALS EMPLOYING 3-DIMENSIONAL MICROWAVE RESONATOR AND CRYSTAL OSCILLATOR

(71) Applicant: AGENCY FOR DEFENSE DEVELOPMENT, Daejeon (KR)

(72) Inventors: Duk Young Kim, Daejeon (KR); Yonggi Jo, Daejeon (KR); Zaeill Kim, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 489 days.

(21) Appl. No.: 17/646,444

(22) Filed: Dec. 29, 2021

(65) Prior Publication Data

US 2022/0207405 A1 Jun. 30, 2022

(30) Foreign Application Priority Data

Dec. 29, 2020 (KR) .................. 10-2020-0185523

(51) Int. Cl.
*G06N 10/40* (2022.01)
*G01R 29/08* (2006.01)
*H03B 5/32* (2006.01)

(52) U.S. Cl.
CPC ......... *G06N 10/40* (2022.01); *G01R 29/0885* (2013.01); *H03B 5/32* (2013.01)

(58) Field of Classification Search
CPC ... G06N 10/00; G02F 2203/15; G02F 1/0311; G02F 1/353; G02F 1/3534; G02F 2/02
See application file for complete search history.

(56) References Cited

U.S. PATENT DOCUMENTS 9,454,061 B1    9/2016 Abdo et al.
2015/0060756 A1  5/2015 Park
(Continued)

FOREIGN PATENT DOCUMENTS

KR    10-1806760 B1    1/2018
KR    10-1829155 B1    2/2018
(Continued)

OTHER PUBLICATIONS

Rueda et Al. Efficient microwave to optical photon conversion: an electro-optical realization. Optica vol. 3, No. 6 / Jun. 2016 (Year: 2016).*

(Continued)

*Primary Examiner* — Collin X Beatty
(74) *Attorney, Agent, or Firm* — Lewis Roca Rothgerber Christie LLP (57) ABSTRACT

An object of the present invention is to provide a microwave-optic conversion system of quantum signals employing a 3-dimensional microwave resonator and a crystal oscillator, which enables microwave-optic conversion employing a microwave resonator and a widely commercialized crystal oscillator which may be manufactured by simple machine processing.

In order to achieve the object, the microwave-optic conversion system of quantum signals employing a 3-dimensional microwave resonator and a crystal oscillator includes: a microwave resonator including a hollow body made of metal, and a penetration hole formed on a front surface of the hollow body; and a crystal oscillator positioned inside the hollow body.

13 Claims, 2 Drawing Sheets

(56) References Cited

U.S. PATENT DOCUMENTS

2016/0125309 A1    5/2016    Naaman et al.
2018/0113373 A1*    4/2018    Witmer .................. G02F 1/017

FOREIGN PATENT DOCUMENTS

KR          10-1949786 B1    2/2019
WO    WO 2015/108615 A1    7/2015

OTHER PUBLICATIONS

Fernandez-Gonzalvo et al., "Cavity-enhanced Raman heterodyne spectroscopy in $Er^{3+}:Y_2SiO_5$ for microwave to optical signal conversion," Physical Review A 100, 033807, Sep. 9, 2019, 9 pages.

Lambert et al., "Coherent Conversion Between Microwave and Optical Photons—An Overview of Physical Implementations," Adv. Quantum Technol. 1900077, Dec. 12, 2019, 15 pages.

Lauk et al., "Perspectives on quantum transduction," Quantum Sci. Technol. 5, 020501, Mar. 17, 2020, 16 pages.

Andrews et al., "Bidirectional and efficient conversion between microwave and optical light," Nature Physics, No. 10, vol. 321, Mar. 23, 2014, 6 pages.

Tsang, "Cavity quantum electro-optics: Input-output relations between traveling optical and microwave fields," Physical Review A 81, 063837, Jun. 30, 2010, 5 pages.

Barzanjeh et al., "Microwave Quantum Illumination," Physical Review Letters 114, 080503, Feb. 27, 2015, 5 pages.

\* cited by examiner

MICROWAVE-OPTIC CONVERSION SYSTEM OF QUANTUM SIGNALS EMPLOYING 3-DIMENSIONAL MICROWAVE RESONATOR AND CRYSTAL OSCILLATOR

CROSS-REFERENCE TO RELATED APPLICATIONS

This application claims the priority of Korean Patent Application No. 10-2020-0185523 filed on Dec. 29, 2020, in the Korean Intellectual Property Office, the disclosure of which is incorporated herein by reference.

BACKGROUND OF THE INVENTION

Field of the Invention

The present invention relates to a microwave-optic conversion system of quantum signals employing a 3-dimensional microwave resonator and a crystal oscillator.

Description of the Related Art

Various types of electromagnetic waves are used in quantum technologies such as a quantum radar, quantum communication, and a quantum computer.

In the case of the quantum radar for detecting a stealth aircraft, an entangled quantum of an optical frequency needs to be converted into an entangled quantum of a microwave frequency for long-distance detection.

In a quantum communication field, a lot of technologies using optical devices using a laser have been mainly developed, and in the quantum computing, superconducting cubits using microwaves are technically preceded.

Likewise, in order to construct a network by integrating different systems, a device is required, which is capable of converting an optical quantum signal into a microwave signal, while converting the microwave signal into the optical signal.

That is, for real implementation of a frequency conversion system, an intermediate system is required, which intermediates both system by interacting with both the optical signal and the microwave signal.

In the conversion devices, a method using an electro-optic effect of a substance, a method using a magneto-optic interaction, a method using atomic ensemble, an optomechanics method with a mechanical oscillator as a medium.

A method for obtaining conversion by generating the interaction between the microwave and the optical wave by using the mechanical oscillator as the medium among them shows high conversion efficiency.

Figure 1:
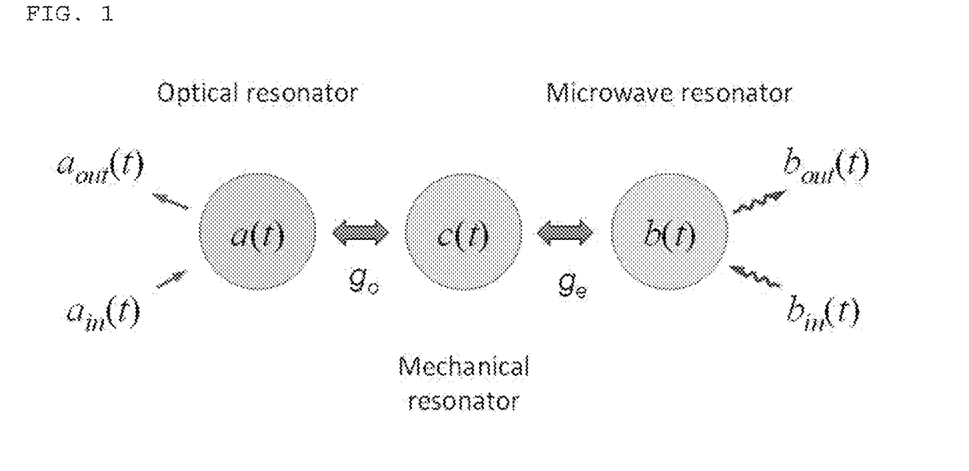
FIG. 1 is a conceptual diagram illustrating a concept of a quantum frequency conversion system.

FIG. 1 is a conceptual diagram illustrating a concept of a quantum frequency conversion system.

A conversion system using a mechanical resonator as a medium may be appreciated through the conceptual diagram illustrated in FIG. 1.

Referring to FIG. 1, each of an optical system and a microwave system forms a resonance mode with an input and an output thereof.

Each of both resonance modes interacts with the mechanical resonator to incur an interaction even between an optical resonance mode and a microwave resonance mode.

In quantum dynamics, both the resonance mode of an electromagnetic wave and the mechanical resonance mode may be expressed as a creation operator and an annihilation operator.

As a result, Hamiltonian of a system constituted by three resonance modes is expressed by Equation (1) below.

$$\hat{H} = \hbar\omega_o \hat{a}^\dagger \hat{a} + \hbar\omega_e \hat{b}^\dagger \hat{b} + \hbar\omega_m \hat{c}^\dagger \hat{c} + \hbar g_o \hat{a}^\dagger \hat{a}(\hat{c}^\dagger + \hat{c}) + \hbar g_e \hat{b}^\dagger \hat{b}(\hat{c}^\dagger + \hat{c}) \quad (1)$$

Here, $\hat{a}^\dagger \hat{a}$ represents the number of photons which exist in the optical resonator, $\hat{b}^\dagger \hat{b}$ represents the number of photons of the microwave resonator, and $\hat{c}^\dagger \hat{c}$ represents the number of phonons of the mechanical resonator.

Further, $(\hat{c}^\dagger + \hat{c})$ represents a displacement x of the mechanical resonator, $g_e$ represents the interaction of the microwave resonance mode and the mechanical resonance mode, and $g_o$ represents a size of the interaction of the optical resonance mode and the mechanical resonance mode.

That is, light of $a_{in}$ is incident to form mode a, and is combined with a mechanical oscillation mode c with a combination rate of $g_o$.

The mechanical oscillation mode is combined with a microwave resonance mode b with a combination rate of $g_e$ to go out to $b_{out}$.

A microwave incident in $b_{in}$ is output to $a_{out}$ through a reverse process.

That is, the microwave of $b_{in}$ is incident to form mode b, and is combined with the mechanical oscillation mode c with the combination rate of $g_e$.

The mechanical oscillation mode is combined with mode a with the combination rate of $g_o$ to be output to $a_{out}$.

In related art, as such a mechanical oscillator, silicon nitride membrane or silicon based photonic crystal is mainly used.

However, the methods have a problem in that the oscillator and a driving circuit should be manufactured by using a high-level nano process.

SUMMARY OF THE INVENTION

In order to solve the problem, an object of the present invention is to provide a microwave-optic conversion system of quantum signals employing a 3-dimensional microwave resonator and a crystal oscillator, which enables microwave-optic conversion employing a microwave resonator and a widely commercialized crystal oscillator which may be manufactured by simple machine processing.

In order to achieve the object, a microwave-optic conversion system of quantum signals employing a 3-dimensional microwave resonator and a crystal oscillator according to the present invention includes: a microwave resonator including a hollow body made of metal, and a penetration hole formed on a front surface of the hollow body; and a crystal oscillator positioned inside the hollow body.

Further, in the crystal oscillator in the microwave-optic conversion system of quantum signals employing a 3-dimensional microwave resonator and a crystal oscillator according to the present invention, a microwave electrode is inserted into the penetration hole.

Further, in the crystal oscillator in the microwave-optic conversion system of quantum signals employing a 3-dimensional microwave resonator and a crystal oscillator according to the present invention, the metal is aluminum or niobium having superconductivity.

Further, in the crystal oscillator in the microwave-optic conversion system of quantum signals employing a 3-dimensional microwave resonator and a crystal oscillator according to the present invention, the microwave resonator forms an LC resonator, and the crystal oscillator forms a capacitance connected to the LC resonator circuit in parallel.

Further, in the crystal oscillator in the microwave-optic conversion system of quantum signals employing a 3-dimensional microwave resonator and a crystal oscillator according to the present invention, each resonance mode between the microwave resonator and the crystal oscillator incurs an interaction.

Further, in the crystal oscillator in the microwave-optic conversion system of quantum signals employing a 3-dimensional microwave resonator and a crystal oscillator according to the present invention, the microwave resonator forms a resonance mode having a long coherence time.

In order to achieve the object, a microwave-optic conversion system of quantum signals employing a 3-dimensional microwave resonator and a crystal oscillator according to the present invention includes: a first mirror and a second mirror; and a crystal oscillator positioned on an optical path determined by a distance between the first mirror and the second mirror.

Further, the microwave-optic conversion system of quantum signals employing a 3-dimensional microwave resonator and a crystal oscillator according to the present invention includes: a hollow body made of metal; and a penetration hole formed on one lateral surface of the hollow body, in which the penetration hole is positioned between the first mirror formed on an external wall of the hollow body and the second mirror formed on an external wall of the hollow body to form an optical resonator.

Further, in the crystal oscillator in the microwave-optic conversion system of quantum signals employing a 3-dimensional microwave resonator and a crystal oscillator according to the present invention, a refractive index of the optical path and the refractive index of the crystal oscillator are different to change a length of the optical path.

Further, in the crystal oscillator in the microwave-optic conversion system of quantum signals employing a 3-dimensional microwave resonator and a crystal oscillator according to the present invention, when a displacement of the crystal oscillator varies by a piezoelectric effect or electromagnetic force, the optical path is changed to incur an interaction between the optical resonator and the crystal oscillator.

Further, in the crystal oscillator in the microwave-optic conversion system of quantum signals employing a 3-dimensional microwave resonator and a crystal oscillator according to the present invention, the interaction forms radiation pressure by momentum exchange between a photon and the crystal oscillator.

Further, in the crystal oscillator in the microwave-optic conversion system of quantum signals employing a 3-dimensional microwave resonator and a crystal oscillator, a magnitude of force actuated by the radiation pressure is a value acquired by dividing an intensity of force by a speed of light.

Further, in the microwave-optic conversion system 1000 of quantum signals employing a 3-dimensional microwave resonator and a crystal oscillator according to the present invention, when the optical path is an integer multiple of a wavelength, an intensity of light has a maximum value.

In order to achieve the object, a microwave-optic conversion system of quantum signals employing a 3-dimensional microwave resonator and a crystal oscillator according to the present invention includes: a hollow body made of metal; a first penetration hole formed on a front surface of the hollow body; a second penetration hole formed on one lateral surface of the hollow body; and a crystal oscillator positioned inside the hollow body.

In order to achieve the object, a microwave-optic conversion system of quantum signals employing a 3-dimensional microwave resonator and a crystal oscillator according to the present invention includes: a hollow body made of metal; a first penetration hole formed on a front surface of the hollow body; a second penetration hole formed on one lateral surface of the hollow body; and a crystal oscillator positioned inside the hollow body, in which a microwave electrode is inserted into the first penetration hole and a microwave resonator is formed by the hollow body and the first penetration hole, and the second penetration hole is positioned between a first mirror formed on an external wall of the hollow body and a second mirror formed on an external wall of the hollow body, and an optical resonator is formed by the first mirror, the second mirror, and the second penetration hole.

In order to achieve the object, a microwave-optic conversion system of quantum signals employing a 3-dimensional microwave resonator and a crystal oscillator according to the present invention includes: a hollow body made of metal; a first penetration hole formed on a front surface of the hollow body; a second penetration hole formed on one lateral surface of the hollow body; and a crystal oscillator positioned inside the hollow body, in which a microwave electrode is inserted into the first penetration hole and a microwave resonator is formed by the hollow body and the first penetration hole, the second penetration hole is positioned between a first mirror formed on an external wall of the hollow body and a second mirror formed on an external wall of the hollow body, and an optical resonator is formed by the first mirror, the second mirror, and the second penetration hole, each of a microwave input into the microwave resonator and an optical signal input into the optical resonator forms a resonance mode, and each formed resonance mode interacts with the crystal oscillator to incur an interaction between the microwave and the optical signal.

Specific details of other exemplary embodiments are included in "Details for carrying out the invention" and accompanying "drawings".

Advantages and/or features of the present invention, and a method for achieving the advantages and/or features will become obvious with reference to various exemplary embodiments to be described below in detail together with the accompanying drawings.

However, the present invention is not limited only to a configuration of each exemplary embodiment disclosed below, but may also be implemented in various different forms. The respective exemplary embodiments disclosed in this specification are provided only to complete disclosure of the present invention and to fully provide those skilled in the art to which the present invention pertains with the category of the invention, and the present invention will be defined only by the scope of each claim of the claims.

According to the present invention, there is an effect of enabling microwave-optic conversion employing a microwave resonator and a widely commercialized crystal oscillator which may be manufactured by simple machine processing.

DETAILED DESCRIPTION OF THE PREFERRED EMBODIMENT

Before describing the present invention in detail, the terms or words used in this specification should not be construed as being unconditionally limited to their ordinary or dictionary meanings, and in order for the inventor of the present invention to describe his/her invention in the best way, concepts of various terms may be appropriately defined and used, and furthermore, the terms or words should be construed as means and concepts which are consistent with a technical idea of the present invention.

That is, the terms used in this specification are only used to describe preferred embodiments of the present invention, and are not used for the purpose of specifically limiting the contents of the present invention, and it should be noted that the terms are defined by considering various possibilities of the present invention.

Further, in this specification, it should be understood that, unless the context clearly indicates otherwise, the expression in the singular may include a plurality of expressions, and similarly, even if it is expressed in plural, it should be understood that the meaning of the singular may be included.

In the case where it is stated throughout this specification that a component "includes" another component, it does not exclude any other component, but further includes any other component unless otherwise indicated.

Furthermore, it should be noted that when it is described that a component "exists in or is connected to" another component, this component may be directly connected or installed in contact with another component, and in inspect to a case where both components are installed spaced apart from each other by a predetermined distance, a third component or means for fixing or connecting the corresponding component to the other component may exist, and the description of the third component or means may be omitted.

On the contrary, when it is described that a component is "directly connected to" or "directly accesses" to another component, it should be understood that the third element or means does not exist.

Similarly, it should be construed that other expressions describing the relationship of the components, that is, expressions such as "between" and "directly between" or "adjacent to" and "directly adjacent to" also have the same purpose.

In addition, it should be noted that if terms such as "one side", "other side", "one side", "other side", "first", "second", etc., are used in this specification, the terms are used to clearly distinguish one component from the other component and a meaning of the corresponding component is not limited used by the terms.

Further, in this specification, if terms related to locations such as "upper", "lower", "left", "right", etc., are used, it should be understood that the terms indicate a relative location in the drawing with respect to the corresponding component and unless an absolute location is specified for their locations, these location-related terms should not be construed as referring to the absolute location.

Further, in this specification, in specifying the reference numerals for each component of each drawing, the same component has the same reference number even if the component is indicated in different drawings, that is, the same reference number indicates the same component throughout the specification.

In the drawings attached to this specification, a size, a location, a coupling relationship, etc. of each component constituting the present invention may be described while being partially exaggerated, reduced, or omitted for sufficiently clearly delivering the spirit of the present invention, and thus the proportion or scale may not be exact.

Further, hereinafter, in describing the present invention, a detailed description of a configuration determined that may unnecessarily obscure the subject matter of the present invention, for example, a detailed description of a known technology including the prior art may be omitted.

Hereinafter, exemplary embodiments of the present invention will be described in detail with reference to related drawings.

Figure 2:
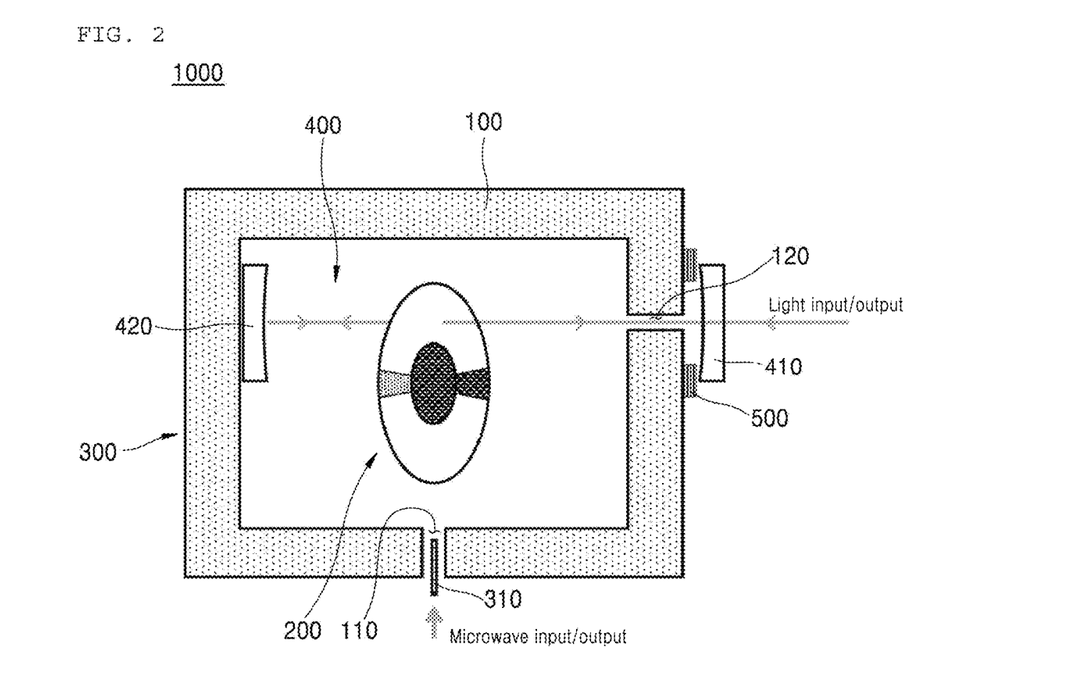
FIG. 2 is a configuration diagram illustrating an overall configuration of a microwave-optic conversion system of quantum signals employing a 3-dimensional microwave resonator and a crystal oscillator.

FIG. 2 is a configuration diagram illustrating an overall configuration of a microwave-optic conversion system of quantum signals employing a 3-dimensional microwave resonator and a crystal oscillator.

Referring to FIG. 2, a microwave-optic conversion system 1000 of quantum signals employing a 3-dimensional microwave resonator and a crystal oscillator according to the present invention includes a crystal oscillator 200, a microwave resonator 300, and an optical resonator 400 which are mechanical resonators.

Each of the microwave resonator 300 and the optical resonator 400 forms a resonance mode with an input and an output thereof.

Each of a microwave resonance mode and an optical resonance mode interacts with the crystal oscillator 300 which is the mechanical resonator to incur an interaction even between the optical resonance mode and the microwave resonance mode.

The microwave-optic conversion system 1000 of quantum signals employing a 3-dimensional microwave resonator and a crystal oscillator includes a hollow body 100 a first penetration hole 110. a second penetration hole 120, and a crystal oscillator 200.

The hollow body 100 may be made of metal, and formed in polyhedral shapes including a cylindrical shape in which an internal part is hollow, a regular hexahedral shape, a rectangular hexahedral shape, etc.

In particular, the metal forming the hollow body 100 may be formed by metal showing a property of superconductivity, such as aluminum or niobium.

The first penetration hole 110 is formed on a front surface of the hollow body 100.

Further, the second penetration hole 120 is formed on one lateral surface of the hollow body 100.

The crystal oscillator 200 is positioned inside the hollow body 100.

The crystal oscillator 200 serves as the mechanical resonator.

Meanwhile, in the microwave-optic conversion system 1000 of quantum signals employing a 3-dimensional microwave resonator and a crystal oscillator, a microwave electrode 310 is inserted into the first penetration hole 110 and the microwave resonator 300 is formed by the hollow body 10 and the first penetration hole 110.

Further, the second penetration hole 120 is positioned between a first mirror 410 formed on an external wall of the hollow body 100 and a second mirror 420 formed on an internal wall of the hollow body 100, and the optical resonator 400 is formed by the first mirror 410, the second mirror 420, and the second penetration hole 120.

By such a configuration, in the microwave-optic conversion system 1000 of quantum signals employing a 3-dimensional microwave resonator and a crystal oscillator, each of the microwave input into the microwave resonator 300 and the optical signal input into the optical resonator 400, i.e., an optical wave forms the resonance mode.

Each resonance mode formed as such interacts with the crystal oscillator 200 to incur mutual conversion between the microwave and the optical signal, i.e., the optical wave.

In other words, FIG. 2 is a schematic diagram of an apparatus that converts a frequency of an optic-electrical signal having a quantum dynamics property.

The system 1000 is largely constituted by three resonators.

The hollow body 100 including the first penetration hole 110, in particular, the hollow body 100 made of the metal forms the microwave resonator 300 and the crystal oscillator 200 which is the mechanical resonator is positioned in the hollow body 100.

In addition, two mirrors (the first mirror 410 and the second mirror 420) are positioned outside and inside the hollow body 100, in particular, the hollow body 100 made of the metal to form the optical resonator 400.

Each of the microwave and the optical signal, i.e., the optical wave input into the system 1000 forms the resonance mode inside the system 1000, and the formed resonance modes simultaneously interact with the crystal oscillator 200 to incur the mutual conversion between the microwave and the optical signal, i.e., the optical wave.

Meanwhile, a piezoelectric element 500 may be included between the second mirror 420 and the hollow body 100.

The piezoelectric element 500 serves to change a length between the first mirror 410 an the second mirror 420, and serves to optimize the optical resonator 400.

As such, microwave-optic conversion is enabled by employing a microwave resonator and a widely commercialized crystal oscillator which may be manufactured by simple machine processing.

Figure 3:
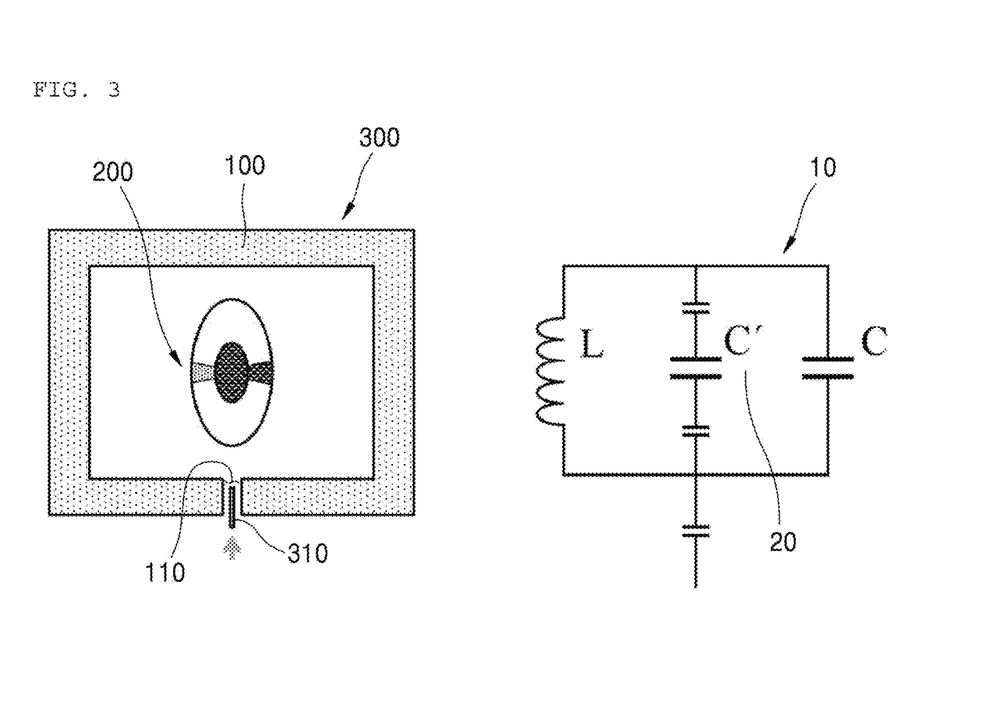
FIG. 3 is a diagram illustrating an interaction of the 3-dimensional microwave resonator and the crystal oscillator in the microwave-optic conversion system of quantum signals employing a 3-dimensional microwave resonator and a crystal oscillator.

FIG. 3 is a diagram illustrating an interaction of the 3-dimensional microwave resonator and the crystal oscillator in the microwave-optic conversion system of quantum signals employing a 3-dimensional microwave resonator and a crystal oscillator.

Referring to FIG. 3, in the microwave-optic conversion system 1000 of quantum signals employing a 3-dimensional microwave resonator and a crystal oscillator according to the present invention, the interaction of the microwave resonator 300 and the crystal oscillator 200 may be described.

The microwave resonator 300 includes the hollow body 100 and the first penetration hole 110.

The hollow body 100 may be made of metal, and formed in polyhedral shapes including a cylindrical shape in which an internal part is hollow, a regular hexahedral shape, a rectangular hexahedral shape, etc.

In particular, the metal forming the hollow body 100 may be formed by metal showing a property of superconductivity, such as aluminum or niobium.

The first penetration hole 110 is formed on a front surface of the hollow body 100.

The crystal oscillator 200 which is the mechanical resonator is positioned inside the hollow body 100.

The microwave electrode 310 is inserted into the first penetration hole 110.

Further, in the microwave-optic conversion system 1000 of quantum signals employing a 3-dimensional microwave resonator and a crystal oscillator according to the present invention, the microwave resonator 300 may form an LC resonator 10.

That is, the microwave resonator 300 may be interpreted to correspond to the LC resonator 10.

In this case the crystal oscillator 200 may form a capacitance 20 connected to an LC resonator circuit in parallel.

Thereby, in the microwave-optic conversion system 1000 of quantum signals employing a 3-dimensional microwave resonator and a crystal oscillator according to the present invention, each resonance mode between the microwave resonator 300 and the crystal oscillator 200 incurs the interaction.

The microwave resonator 300 forms a resonance mode having a long coherence time.

In other words, FIG. 3 illustrates only the microwave resonator 300 and the crystal oscillator 200 which is the mechanical resonator except for the optical resonator 400.

When an empty space having several centimeter size, which is a hollow state is formed inside the hollow body 100, in particular, the hollow body 100 made of the metal, the resonance mode of the microwave is formed in the empty space.

The microwave resonator 300 made of the metal, which shows the property of the superconductivity, such as aluminum or niobium forms a resonance mode having a very long coherence time.

The 3-dimensional microwave resonator 300 may be interpreted to correspond to the simple LC resonator 10, and the capacitance 20 of the crystal oscillator 200 which is the mechanical resonator is connected to the circuit in parallel to incur the interaction between both resonance modes.

The interaction is expressed by Equation (2) below.

$$\delta C \simeq \frac{C^2}{(C+C')^2} \frac{\partial C'}{\partial x} \delta x \quad (2)$$

Figure 4:
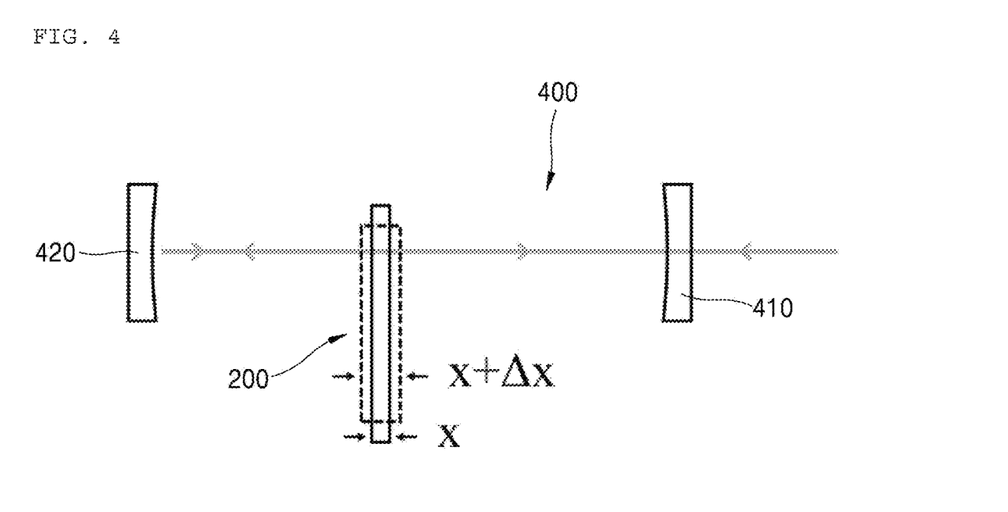
FIG. 4 is a diagram illustrating an interaction of an optical resonator and the crystal oscillator in the microwave-optic conversion system of quantum signals employing a 3-dimensional microwave resonator and a crystal oscillator.

FIG. 4 is a diagram illustrating an interaction of an optical resonator and the crystal oscillator in the microwave-optic conversion system of quantum signals employing a 3-dimensional microwave resonator and a crystal oscillator.

Referring to FIG. 4, in the microwave-optic conversion system 1000 of quantum signals employing a 3-dimensional microwave resonator and a crystal oscillator according to the present invention, the interaction of the microwave resonator 400 and the crystal oscillator 200 which is the mechanical resonator may be described.

In order to form the optical resonator 400, first, the first mirror 410 and the second mirror 420, and the crystal oscillator 200 positioned on an optical path determined by a distance between the first mirror 410 and the second mirror 420 are positioned.

Further, the hollow body 100 made of the metal and the second penetration hole 120 formed on one lateral surface of the hollow body 100 are formed.

In this case, the first mirror 410 is formed on the external wall of the hollow body 100, the second mirror is formed on the internal wall of the hollow body 100, and the second penetration hole 120 is positioned between the first mirror 410 and the second mirror 420 to form the optical resonator 400.

Here, the hollow body 100 may be made of metal, and formed in polyhedral shapes including a cylindrical shape in which an internal part is hollow, a regular hexahedral shape, a rectangular hexahedral shape, etc.

In particular, the metal forming the hollow body 100 may be formed by metal showing a property of superconductivity, such as aluminum or niobium.

The second penetration hole 120 is formed on one lateral surface of the hollow body 100.

Further, the crystal oscillator 200 is positioned in the hollow body 100.

By such a configuration, in the microwave-optic conversion system 1000 of quantum signals employing a 3-dimensional microwave resonator and a crystal oscillator according to the present invention, a refractive index of the optical path and the refractive index of the crystal oscillator are different to change the length of the optical path.

Meanwhile, when the displacement of the crystal oscillator 200 varies by a piezoelectric effect or electromagnetic force, the optical path is changed to incur the interaction between the optical resonator 400 and the crystal oscillator 200.

In this case, the interaction forms radiation pressure by momentum exchange between the photon and the crystal oscillator 200.

A magnitude of force actuated by the radiation pressure is a value acquired by dividing an intensity of force by a speed of light.

Further, in the microwave-optic conversion system 1000 of quantum signals employing a 3-dimensional microwave resonator and a crystal oscillator according to the present invention, when the optical path is an integer multiple of a wavelength, the intensity of the light has a maximum value.

In other words, FIG. 4 illustrates the optical resonator 400 and the crystal oscillator 200 which is the mechanical resonator except for the microwave resonator 300. The optical resonance mode is formed between the first mirror 410 and the second mirror 420, and when the optical path determined by the distance between the first mirror 410 and the second mirror 420 is the integer multiple of the wavelength, the intensity of the light has the maximum value.

When the crystal oscillator 200 which is the mechanical resonator is positioned on the optical path, since the refractive index of the crystal oscillator 200 and the refractive index of the optical path are different, the length of the path is changed.

Further, hen the displacement of the crystal oscillator 200 varies by the piezoelectric effect or the electromagnetic force, the optical path is changed to incur the interaction between the optical resonator 400 and the crystal oscillator 200 which is the mechanical resonator.

The interaction may be described in terms of the radiation pressure by the momentum exchange between the photon and the crystal oscillator 200 which is the mechanical resonator.

The magnitude of the force actuated by the radiation pressure is a value acquired by dividing P which is the intensity of the light by C which is the speed of the light, and is expressed by Equation (3) below.

$$F_{rad} = \frac{2P_{cavity}}{c_{cavity}} \quad (3)$$

As such, a largest feature of the present invention is that the 3D microwave resonator 300 which is easily manufactured and the crystal oscillator 200 which may be easily acquired in the market is used.

Since the nano process need not be used, there is an advantage in that practical conversion efficiency may be obtained due to a property of a converter which is easily manufactured and operates at a low temperature.

The crystal oscillator 200 which is the mechanical oscillator and the microwave resonator 300 form the capacitance and are coupled, and when the optical resonator 400 and the microwave resonator 300 have optical wave and microwave inputs (driving field), Hamiltonian is transformed as in Equation (4) below.

$$\hat{H} = \hbar\omega_o \hat{a}^\dagger \hat{a} + \hbar\omega_e \hat{b}^\dagger \hat{b} + \hbar\omega_m \hat{c}^\dagger \hat{c} + \quad (4)$$
$$\hbar g_o \hat{a}^\dagger \hat{a}(\hat{c}^\dagger + \hat{c}) + \hbar g_e (\hat{b}^\dagger + \hat{b})^2 (\hat{c}^\dagger + \hat{c}) +$$
$$i\hbar E_o(\hat{a}^\dagger e^{-i\omega_{d,o} t} - \hat{a} e^{i\omega_{d,o} t}) + i\hbar E_e(e^{i\omega_{d,o} t} - e^{-i\omega_{d,o} t})(\hat{b}^\dagger + \hat{b})$$

Here, $\hat{a}^\dagger \hat{a}$ represents the number of photons which exist in the optical resonator 400, $\hat{b}^\dagger \hat{b}$ represents the number of photons of the microwave resonator 300, and $\hat{c}^\dagger \hat{c}$ represents the number of phonons of the mechanical resonator.

$E_o$ and $E_e$ represent intensities of electric fields for driving the optical resonator 400 and the microwave resonator 300, respectively.

When Hamiltonian is linearized with respect to a steady-state field based on an average photon number, an input-output relationship of the resonance mode is expressed by Equation (5) as below.

$$\begin{bmatrix} \hat{\alpha}_{out}(\omega_m) \\ \hat{\beta}_{out}(\omega_m) \end{bmatrix} = \begin{bmatrix} C_{11}(\omega_m) & C_{12}(\omega_m) & C_{13}(\omega_m) & C_{14}(\omega_m) \\ C_{21}(\omega_m) & C_{22}(\omega_m) & C_{23}(\omega_m) & C_{24}(\omega_m) \end{bmatrix} \begin{bmatrix} \hat{\alpha}_i(\omega_m) \\ \hat{\beta}_i(\omega_m) \\ \hat{\alpha}_{loss}(\omega_m) \\ \hat{\beta}_{loss}(\omega_m) \end{bmatrix} \quad (5)$$

$$\hat{\alpha} = \hat{a} - \sqrt{N_o}, \hat{\beta} = \hat{b} - \sqrt{N_e}$$

Here, $\hat{\alpha}_{out}(\omega)$ represents an output annihilation operator inside the optical resonator, represents $\hat{\beta}_{out}(\omega)$ an output annihilation operator inside the microwave resonator, $\hat{\alpha}_{in}(\omega)$ represents an input annihilation operator inside the optical resonator, and $\hat{\beta}_{in}(\omega)$ represents an input annihilation operator inside the microwave resonator.

Coefficients from $C_{11}(\omega)$ to $C_{25}(\omega)$ represent a relational equation between the input and output operators.

$N_o$ represents the number of photons inside the optical resonator, $N_e$ represents the number of photons inside the microwave resonator, and $\omega$ represents a difference between a frequency of an input/output wave and a resonance frequency of the resonator.

The optical-microwave conversion efficiency is expressed by Equation (6) below by the relational equation of Equation (5) above.

$$|C_{12}(\omega)|^2 = |C_{21}(\omega)|^2 \quad (6)$$

Here, since $C_{12}(\omega)$ represents a coefficient in which the microwave input is converted into an optical output as shown in Equation (5) and $C_{21}(\omega)$ represents a coefficient in which the optical input is converted into the microwave output, a square of absolute values of the corresponding coefficients represents a probability that an input photon will be converted.

As described above, according to the present invention, there is an effect of enabling microwave-optic conversion employing a microwave resonator and a widely commercialized crystal oscillator which may be manufactured by simple machine processing.

In the above, although several preferred embodiments of the present invention have been described with some examples, the descriptions of various exemplary embodiments described in the "Specific Content for Carrying Out the Invention" item are merely exemplary, and it will be appreciated by those skilled in the art that the present invention can be variously modified and carried out or equivalent executions to the present invention can be performed from the above description.

In addition, since the present invention can be implemented in various other forms, the present invention is not limited by the above description, and the above description is for the purpose of completing the disclosure of the present invention, and the above description is just provided to completely inform those skilled in the art of the scope of the present invention, and it should be known that the present invention is only defined by each of the claims.

What is claimed is:

1. A microwave-optic conversion system of quantum signals employing a 3-dimensional microwave resonator and a crystal oscillator, comprising:
    a first mirror and a second mirror;
    a crystal oscillator positioned on an optical path determined by a distance between the first mirror and the second mirror;
    a hollow body made of metal; and
    a penetration hole formed on one lateral surface of the hollow body,
    wherein the penetration hole is positioned between the first mirror formed on an external wall of the hollow body and the second mirror formed on an internal wall of the hollow body to form an optical resonator.

2. The microwave-optic conversion system of quantum signals employing a 3-dimensional microwave resonator and a crystal oscillator of claim 1, wherein a microwave electrode is inserted into the penetration hole.

3. The microwave-optic conversion system of quantum signals employing a 3-dimensional microwave resonator and a crystal oscillator of claim 1, wherein the metal is aluminum or niobium having superconductivity.

4. The microwave-optic conversion system of quantum signals employing a 3-dimensional microwave resonator and a crystal oscillator of claim 1, wherein the microwave resonator forms an LC resonator, and
    the crystal oscillator forms a capacitance connected to the LC resonator circuit in parallel.

5. The microwave-optic conversion system of quantum signals employing a 3-dimensional microwave resonator and a crystal oscillator of claim 4, wherein each resonance mode between the microwave resonator and the crystal oscillator incurs an interaction.

6. The microwave-optic conversion system of quantum signals employing a 3-dimensional microwave resonator and a crystal oscillator of claim 1, wherein the microwave resonator forms a resonance mode having a long coherence time.

7. The microwave-optic conversion system of quantum signals employing a 3-dimensional microwave resonator and a crystal oscillator of claim 1, wherein a refractive index of the optical path and the refractive index of the crystal oscillator are different to change a length of the optical path.

8. The microwave-optic conversion system of quantum signals employing a 3-dimensional microwave resonator and a crystal oscillator of claim 7, wherein when a displacement of the crystal oscillator varies by a piezoelectric effect or electromagnetic force, the optical path is changed to incur an interaction between the optical resonator and the crystal oscillator.

9. The microwave-optic conversion system of quantum signals employing a 3-dimensional microwave resonator and a crystal oscillator of claim 8, wherein the interaction forms radiation pressure by momentum exchange between a photon and the crystal oscillator.

10. The microwave-optic conversion system of quantum signals employing a 3-dimensional microwave resonator and a crystal oscillator of claim 9, wherein a magnitude of force actuated by the radiation pressure is a value acquired by dividing an intensity of force by a speed of light.

11. The microwave-optic conversion system of quantum signals employing a 3-dimensional microwave resonator and a crystal oscillator of claim 7, wherein when the optical path is an integer multiple of a wavelength, an intensity of light has a maximum value.

12. A microwave-optic conversion system of quantum signals employing a 3-dimensional microwave resonator and a crystal oscillator, comprising:
    a hollow body made of metal;
    a first penetration hole formed on a front surface of the hollow body;
    a second penetration hole formed on one lateral surface of the hollow body; and
    a crystal oscillator positioned inside the hollow body,
    wherein a microwave electrode is inserted into the first penetration hole and a microwave resonator is formed by the hollow body and the first penetration hole,
    the second penetration hole is positioned between a first mirror formed on an external wall of the hollow body and a second mirror formed on an internal wall of the hollow body, and an optical resonator is formed by the first mirror, the second mirror, and the second penetration hole.

13. A microwave-optic conversion system of quantum signals employing a 3-dimensional microwave resonator and a crystal oscillator, comprising:
    a hollow body made of metal;
    a first penetration hole formed on a front surface of the hollow body;
    a second penetration hole formed on one lateral surface of the hollow body; and
    a crystal oscillator positioned inside the hollow body,
    wherein a microwave electrode is inserted into the first penetration hole and a microwave resonator is formed by the hollow body and the first penetration hole,
    the second penetration hole is positioned between a first mirror formed on an external wall of the hollow body and a second mirror formed on an internal wall of the hollow body, and an optical resonator is formed by the first mirror, the second mirror, and the second penetration hole,
    each of a microwave input into the microwave resonator and an optical signal input into the optical resonator forms a resonance mode, and each formed resonance mode interacts with the crystal oscillator to incur an interaction between the microwave and the optical signal.

\* \* \* \* \*